United States Patent
Zhang et al.

(10) Patent No.: US 9,851,571 B1
(45) Date of Patent: Dec. 26, 2017

(54) APPARATUS FOR GENERATING A LINE-BEAM FROM A DIODE-LASER ARRAY

(71) Applicant: Coherent, Inc., Santa Clara, CA (US)

(72) Inventors: Rui Zhang, Palo Alto, CA (US); Andrea Caprara, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 15/236,774

(22) Filed: Aug. 15, 2016

Related U.S. Application Data

(60) Provisional application No. 62/368,078, filed on Jul. 28, 2016.

(51) Int. Cl.
  *H01S 3/08* (2006.01)
  *G02B 27/20* (2006.01)
  *G02B 27/09* (2006.01)
  *G02B 27/30* (2006.01)

(52) U.S. Cl.
  CPC ..... *G02B 27/0961* (2013.01); *G02B 27/0927* (2013.01); *G02B 27/0966* (2013.01); *G02B 27/30* (2013.01)

(58) Field of Classification Search
  CPC .. G02B 27/09; G02B 27/0938; G02B 27/095; G02B 27/0955; G02B 27/0961; G02B 27/0966; G02B 27/30; G02B 3/0006; H01S 5/02252; H01S 5/02288; H01S 5/18388; H01S 5/0267
  USPC ................... 359/619, 641; 372/101; 362/259
  See application file for complete search history.

(56) References Cited

U.S. PATENT DOCUMENTS

| 6,773,142 | B2 | 8/2004 | Rekow |
| 7,016,393 | B2 | 3/2006 | Anikitchev et al. |
| 7,046,711 | B2 | 5/2006 | Kopf et al. |
| 7,265,905 | B2 | 9/2007 | Wada et al. |
| 7,265,908 | B2 | 9/2007 | Anikitchev |
| 8,596,823 | B2 * | 12/2013 | Kuchibhotla ...... G02B 27/0961 362/259 |

OTHER PUBLICATIONS

Kohler et al., "11 KW Direct Diode Laser System with Homogenized 55×20 mm² Top-Hat Intensity Distribution", Dilas Diodenlaser Gmbh, 2007, 12 pages.
Wetter, N. U., "Three-Fold Effective Brightness Increase of Laser Diode Bar Emission by Assessment and Correction of Diode Array Curvature", Optics and Laser Technology, vol. 33, 2001, pp. 181-187.

* cited by examiner

*Primary Examiner* — William Choi
(74) *Attorney, Agent, or Firm* — Morrison & Foerster LLP

(57) ABSTRACT

Apparatus for generating a line-beam includes a diode-laser bar, a linear micro-lens array, and a plurality of lenses spaced apart and arranged along an optical axis. The linear micro-lens array and the lenses shape laser-radiation emitted by the diode-laser bar to form a uniform line-beam in an illumination plane. The lenses project a far-field image of the diode-laser bar onto an image plane proximate to the illumination plane. The diode-laser bar is rotated from parallel alignment with the linear micro-lens array for providing uniform line-beam illumination over a range of locations along the optical axis.

29 Claims, 11 Drawing Sheets

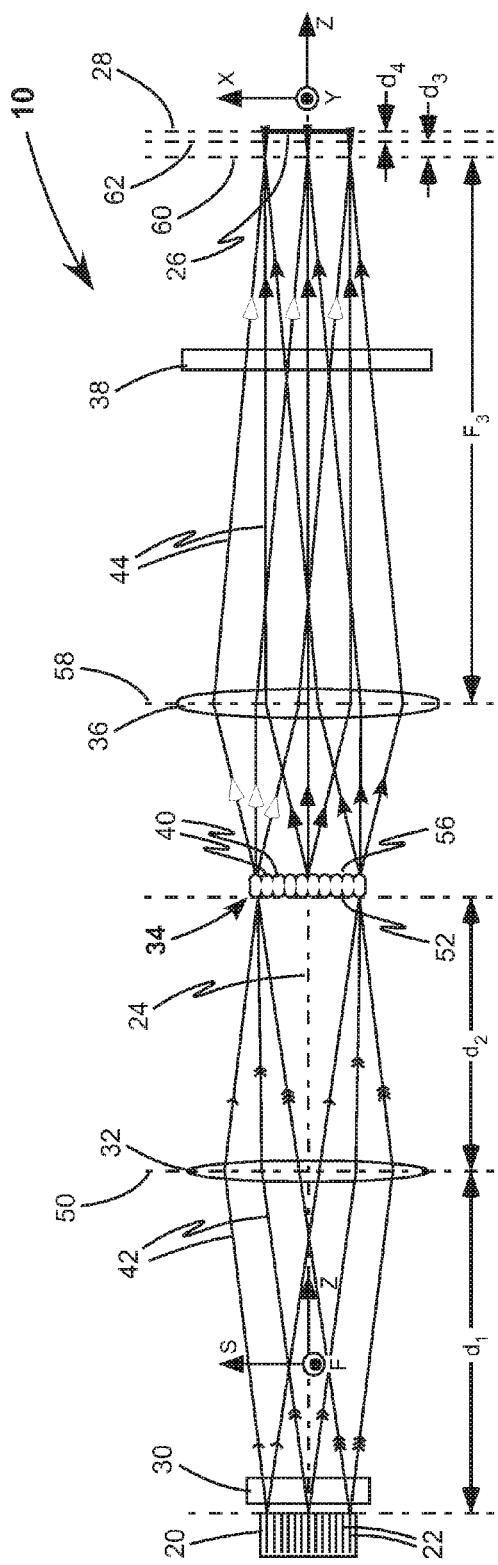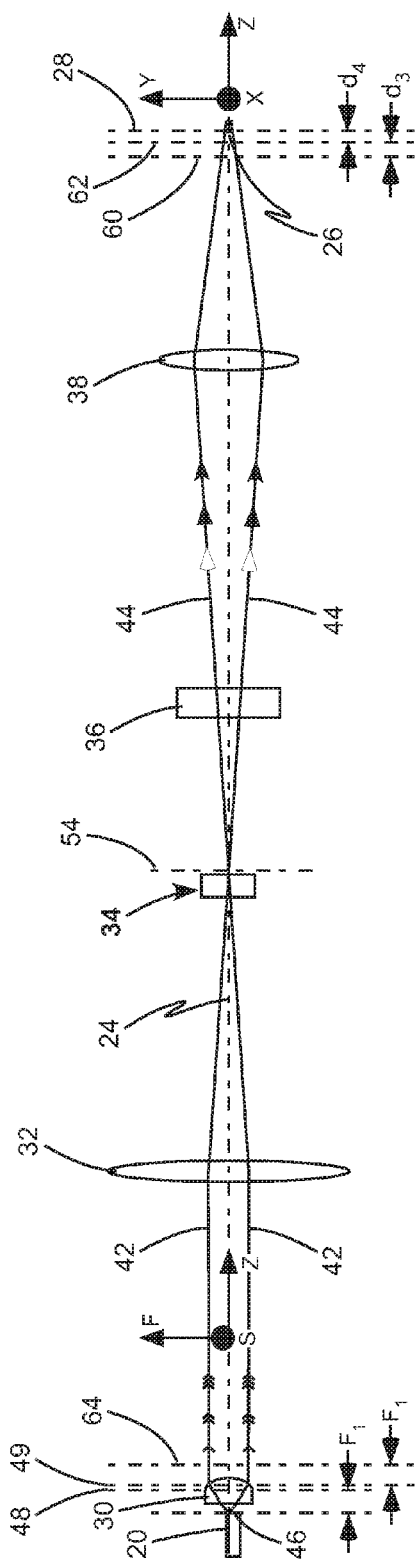
FIG. 2A
FIG. 2B

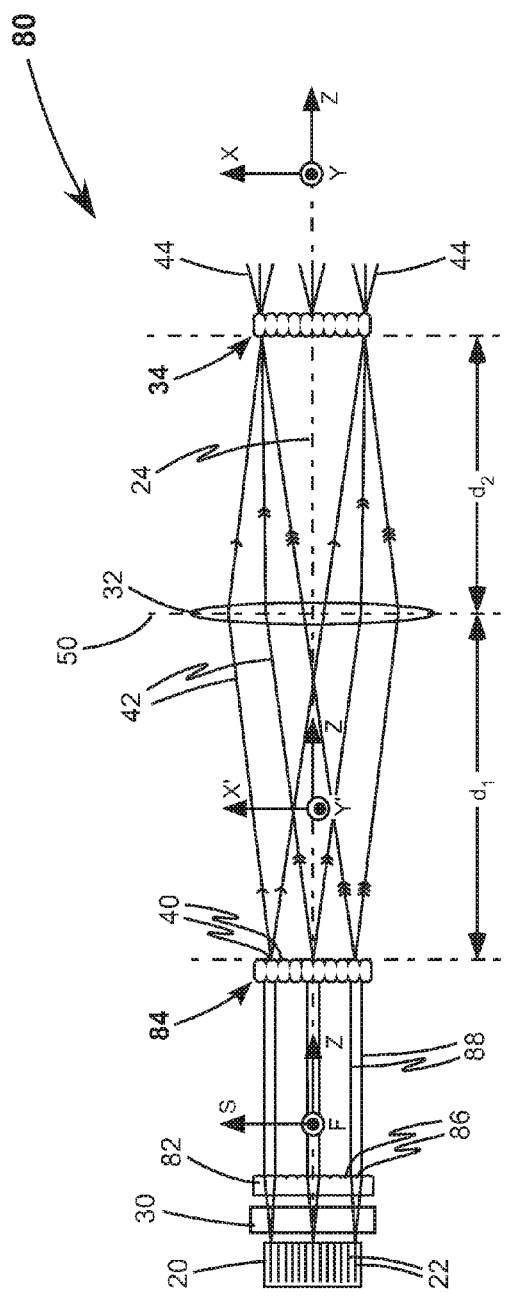
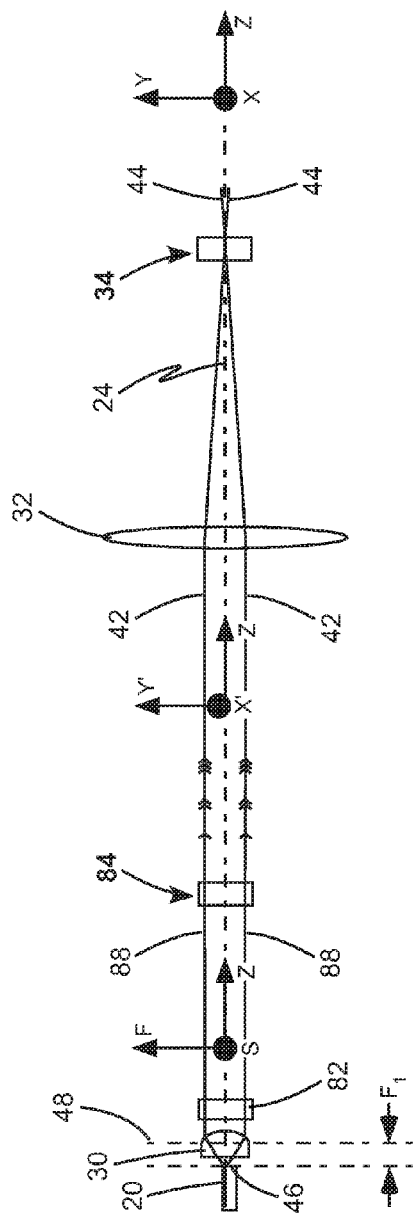
FIG. 8A
FIG. 8B

APPARATUS FOR GENERATING A LINE-BEAM FROM A DIODE-LASER ARRAY

PRIORITY

This application claims priority to U.S. Provisional Patent Application Ser. No. 62/368,078, filed on Jul. 28, 2016, the entire disclosure of which is incorporated herein by reference.

TECHNICAL FIELD OF THE INVENTION

The present invention relates in general to shaping light from diode-lasers. It relates in particular to shaping light from an array of diode-laser emitters into a beam of radiation having a uniform elongated cross section.

DISCUSSION OF BACKGROUND ART

Diode-lasers are efficient devices for converting electrical power into coherent optical power. An edge-emitting diode-laser has a diode-laser emitter, which is waveguide resonator, grown on a single-crystal substrate. The diode-laser emitter emits laser-radiation through an end facet in an emission direction. The diode-laser emitter is typically between 500 micrometers (μm) and 2,000 μm long, between 40 μm and 200 μm wide, and about 1 μm high. The laser-radiation is weakly divergent in a slow-axis direction (parallel with emitter width) and strongly divergent in a fast-axis direction (parallel with emitter height). The slow-axis, fast-axis, and emission directions are mutually perpendicular.

For high-power applications, a diode-laser bar having a plurality of diode-laser emitters provide a convenient way to scale the optical power available from a single diode-laser emitter. A diode-laser bar has typically between 10 and 60 such diode-laser emitters spaced apart and arranged in a "horizontal" linear array thereof. The distance between the centers of adjacent diode-laser emitters is generally referred to as "pitch". A typical diode-laser bar has pitch between 150 μm and 500 μm. Diode-laser emitters are usually on a "top" surface of the diode-laser bar, which is typically between about 50 μm and 200 μm in height. Laser-radiation is emitted from all the diode-laser emitters through a common "front facet" in a common emission direction.

A "packaged" diode-laser bar is mounted on a cooling base for mechanical protection and to remove waste heat, usually by soldering. However, soldering a relatively-thin diode-laser bar onto a rigid cooling base causes mechanical stress that can displace the diode-laser emitters from an ideal linear alignment. The displacement from the ideal linear alignment is referred to as "smile" by practitioners of the art.

Packaged diode-laser bars may be selected for minimal smile. However, additional metrology and reduced yield increase cost. Smile may be mitigated by selecting a ductile "soft solder", such as indium. However, soft solders are more vulnerable to failure, due to atomic diffusion and oxidation. Various schemes have been proposed to pre-compensate the mechanical stress caused by "hard solder", such as gold-tin. However, such schemes add cost and complexity to packaging.

Lasers have become essential sources for uniform illumination in a wide range of applications, including surface inspection of semi-conductor materials, thermal annealing of display-screen glass, and rapid assay of bio-medical fluids. A common requirement is an elongated beam of laser-radiation that uniformly illuminates a line on a flat surface or a plane in a volume of transparent material. Such elongated beams of laser-radiation are referred to generally as "line-beams." Diode-laser bars have advantages as line-beam sources, including high-power and an elongated emission cross-section. However, it is necessary to overcome an inherent non-uniformity of emission from a plurality of spatially-distributed diode-laser emitters.

An optical device for transforming a beam of radiation to make it uniform in power across a cross-section of the beam is generally referred to as a "beam homogenizer". Beam homogenizers often include a "micro-lens array", comprising a plurality of tiny lenses, each much smaller than the incident beam. Each micro-lens becomes a source contributing to the transformed beam. "Pitch" of a beam homogenizer is the distance between centers of adjacent micro-lenses.

Additional optics are required to collect and shape the plurality of beams emerging from all the micro-lenses intercepting the incident beam. A linear array of micro-lenses may be used as a beam homogenizer for an elongated beam of laser-radiation emitted by a diode-laser bar. One example of such a beam homogenizer is described in U.S. Pat. No. 7,265,908. However, line-beams created by such devices are degraded by smile. Variances in smile between diode-laser bars cause variances in the dimensions of line-beams created by beam homogenization. While prior-art devices can create a uniform line-beam at one location along a transformed beam, they are unable to provide uniform illumination along a range of locations.

There is need for an improved device for shaping a line-beam from a diode-laser bar that is insensitive to smile and to variances in smile. Preferably, the beam-shaping device creates a line-beam that remains uniform over a range of locations along the emission direction.

SUMMARY OF THE INVENTION

In one aspect, a line-beam generating apparatus in accordance with the present invention comprises a diode-laser bar emitting laser-radiation in an emission direction. The diode-laser bar has perpendicular slow-axis and fast-axis directions. A collimating lens is provided. The collimating lens is arranged to intercept the laser-radiation and collimate the laser-radiation in the fast-axis direction. A focusing lens and a linear micro-lens array are provided. The linear micro-lens array has a plurality of cylindrical micro-lenses arranged in an elongated array thereof. The linear micro-lens array has a first direction parallel with the elongated array of cylindrical micro-lenses and a second direction perpendicular to the elongated array of cylindrical micro-lenses. A first cylindrical lens and a second cylindrical lens are provided. The collimating lens, the focusing lens, the linear micro-lens array, the first cylindrical lens, and the second cylindrical lens are located in recited order along an optical axis in the emission direction, and are arranged to form the line-beam from the laser-radiation emitted from the diode-laser bar. The slow-axis and fast-axis directions are rotated from parallel alignment with the first and second directions by a fixed angle of at least 2°.

In another aspect of the present invention, a line-beam generating apparatus comprises a diode-laser bar emitting laser-radiation in an emission direction. The diode-laser bar has perpendicular slow-axis and fast-axis directions. A fast-axis collimating lens is provided. The fast-axis collimating lens is arranged to intercept the laser-radiation and collimate the laser-radiation in the fast-axis direction. A first linear micro-lens array is provided. The first linear micro-lens array has a plurality of first cylindrical micro-lenses arranged in an elongated array thereof. The first linear micro-lens array has a first direction parallel with the elongated array of first cylindrical micro-lenses and a second direction perpendicular to the elongated array of first cylindrical micro-lenses. A focusing lens and a second linear micro-lens array are provided. The second linear micro-lens array has a plurality of second cylindrical micro-lenses arranged in an elongated array thereof. The second linear micro-lens array has a third direction parallel with the elongated array of second cylindrical micro-lenses and a fourth direction perpendicular to the elongated array of second cylindrical micro-lenses. A cylindrical lens is provided. The fast-axis collimating lens, the first linear micro-lens array, the focusing lens, the second linear micro-lens array, and the cylindrical lens are located in recited order along an optical axis in the emission direction, and are arranged to form the line-beam from the laser-radiation emitted by the diode-laser bar. The first and second directions are rotated from parallel alignment with the third and fourth directions by a fixed angle of at least 2°.

In yet another aspect of the present invention, a line-beam generating apparatus comprises a diode-laser bar emitting laser-radiation in an emission direction. The diode-laser bar has perpendicular slow-axis and fast-axis directions. A collimating lens is provided. The collimating lens is arranged to intercept the laser-radiation and collimate the laser-radiation in the fast-axis direction. A focusing lens and a linear micro-lens array are provided. The linear micro-lens array has a plurality of cylindrical micro-lenses arranged in an elongated array thereof. The linear micro-lens array has a first direction parallel with the elongated array of cylindrical micro-lenses and a second direction perpendicular to the elongated array of cylindrical micro-lenses. The slow-axis and fast-axis directions are rotated from parallel alignment with the first and second directions by a fixed angle of at least 2°. The focusing lens and the linear micro-lens array are arranged for uniform illumination of the linear micro-lens array by the laser-radiation. A cylindrical lens is provided. The collimating lens, the focusing lens, the linear micro-lens array, and the cylindrical lens are located in recited order along an optical axis in the emission direction, and are arranged to form the line-beam in a first illumination plane from the laser-radiation emitted by the diode-laser bar. An aperture is provided. The aperture is located in a second illumination plane. The aperture is arranged to partially block the line-beam in the first direction. A spherical lens is provided. The spherical lens is located on the optical axis and arranged to project an image of the partially-blocked line-beam in the second illumination plane to a third illumination plane.

In still another aspect of the present invention, a line-beam generating apparatus comprises a diode-laser bar emitting laser-radiation in an emission direction. The diode-laser bar has perpendicular slow-axis and fast-axis directions. A fast-axis collimating lens is provided. The fast-axis collimating lens is arranged to intercept the laser-radiation and collimate the laser-radiation in the fast-axis direction. A first linear micro-lens array is provided. The first linear micro-lens array has a plurality of first cylindrical micro-lenses arranged in an elongated array thereof. The first linear micro-lens array has a first direction parallel with the elongated array of first cylindrical micro-lenses and a second direction perpendicular to the elongated array of first cylindrical micro-lenses. A focusing lens and a second linear micro-lens array are provided. The second linear micro-lens array has a plurality of second cylindrical micro-lenses arranged in an elongated array thereof. The second linear micro-lens array has a third direction parallel with the elongated array of second cylindrical micro-lenses and a fourth direction perpendicular to the elongated array of second cylindrical micro-lenses. The first and second directions are rotated from parallel alignment with the third and fourth directions by a fixed angle of at least 2°. The focusing lens and the second linear micro-lens array are arranged for uniform illumination of the second linear micro-lens array by the laser-radiation. A cylindrical lens is provided. The fast-axis collimating lens, the first linear micro-lens array, the focusing lens, the second linear micro-lens array, and the cylindrical lens are located in recited order along an optical axis in the emission direction, and are arranged to form the line-beam in a first illumination plane from the laser-radiation emitted by the diode-laser bar. An aperture is provided. The aperture is located in a second illumination plane. The aperture is arranged to partially block the line-beam in the third direction. A spherical lens is provided. The spherical lens is located on the optical axis and arranged to project an image of the partially-blocked line-beam in the second illumination plane to a third illumination plane.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 2A is a plan view from above schematically illustrating rays of laser-radiation propagating through the line-beam generating apparatus of FIG. 1.

FIG. 2B is a side-elevation view schematically illustrating rays of laser-radiation propagating through the line-beam generating apparatus of FIG. 1.

FIG. 8A is a plan view from above schematically illustrating another preferred embodiment of line-beam generating apparatus in accordance with the present invention, similar to the embodiment of FIG. 1, but further comprising another linear micro-lens array.

FIG. 8B is a side-elevation view of line-beam generating apparatus of FIG. 8A.

DETAILED DESCRIPTION OF THE INVENTION

Figure 1:
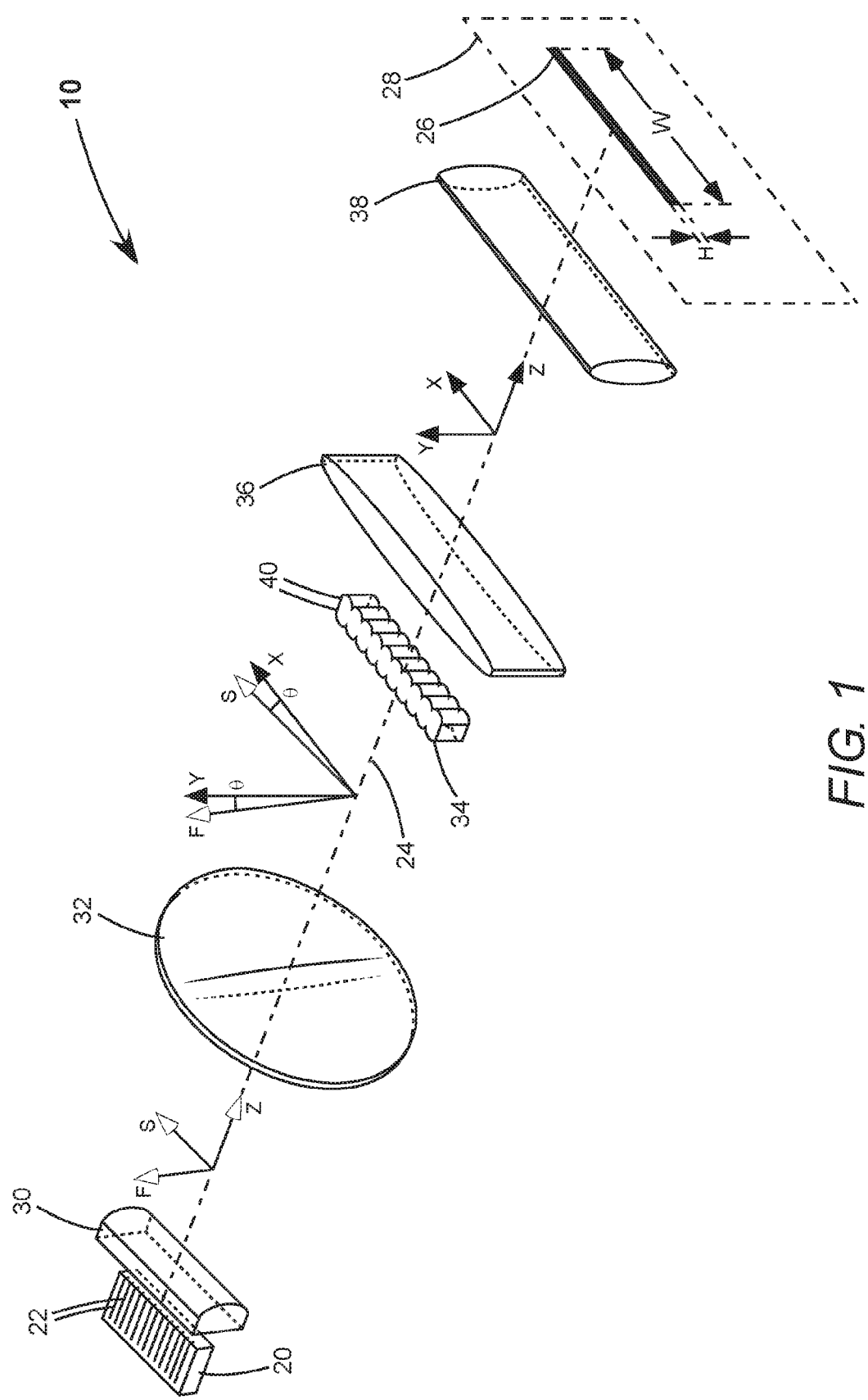
FIG. 1 is a three-dimensional view schematically illustrating one preferred embodiment of line-beam generating apparatus in accordance with the present invention, for illuminating an elongated area in an illumination plane, comprising a diode-laser bar, a collimating lens, a focusing lens, a linear micro-lens array, and two cylindrical lenses arranged along an optical axis.

Turning now to the drawings, wherein like features are designated by like reference numerals, FIG. 1 schematically illustrates one preferred embodiment 10 of line-beam generating apparatus in accordance with the present invention. Apparatus 10 comprises a diode-laser bar 20 and a plurality of optical components described further herein below. Diode-laser bar 20 has characteristic slow-axis "S", fast-axis "F", and emission "Z" directions, as indicated in the drawing. Diode-laser bar 20 has a plurality of diode-laser emitters 22 arranged in a linear array thereof, parallel with the slow-axis direction. The optical components are arranged along an optical axis 24 that is co-linear with the emission direction. Diode-laser bar 20 and the optical components are arranged to shape laser-radiation emitted by the diode-laser bar to form an elongated line-beam 26 in an illumination plane 28 that is perpendicular to optical axis 24.

The optical components are, in order along the emission direction from diode-laser bar 20: a fast-axis collimating lens 30, a focusing lens 32, a linear micro-lens array 34, a cylindrical lens 36, and a cylindrical lens 38. Fast-axis collimating lens 30 has positive optical power in the fast-axis direction and zero optical power in the slow-axis direction. Focusing lens 32 has positive optical powers in the fast-axis and slow-axis directions.

Linear micro-lens array 34 includes a plurality of cylindrical micro-lenses 40 arranged in a linear array thereof along a transverse direction "X". Each cylindrical micro-lens 40 has positive optical power in the X direction and zero optical power in a direction "Y" perpendicular to the X direction. Cylindrical lens 36 has positive optical power in the X direction and zero optical power in the Y direction. Cylindrical lens 38 has zero optical power in the X direction and positive optical power in the Y direction.

The emission direction of the diode-laser bar is also the propagation direction "Z" of laser-radiation through all the optical components. Elongated line-beam 26 has dimensions width "W" and height "H", which are aligned with the X and Y directions, respectively. The slow-axis and fast-axis directions of the diode-laser bar are rotated from parallel alignment with the X and Y directions of the linear micro-lens array by a fixed angle "θ", which is between about 2° and 20°. Angle θ is 7° in the drawing.

FIGS. 2A and 2B schematically illustrate line-beam generating apparatus 10, depicting exemplary rays of laser-radiation 42 emitted from diode-laser emitters 22 and exemplary rays of laser-radiation 44 emanating from cylindrical micro-lenses 40. Rays from a common diode-laser emitter or rays from a common cylindrical micro-lens have the same arrow type in the drawings. Rays having extreme divergence are depicted for each diode-laser emitter or cylindrical micro-lens. FIG. 2A is a plan view from above, that is in the X-Z plane. FIG. 2B is a side-elevation view, that is in the X-Z plane. Elements of apparatus 10 are described herein below with continuing reference to FIG. 1, FIG. 2A, and FIG. 2B.

Rays of laser-radiation 42 emitted through a front facet 46 of diode-laser bar 20 are highly divergent in the fast-axis direction, diverging at a full-width half maximum (FWHM) angle between about 30° and 50°. Fast-axis collimating lens 30 has an input principal plane 48, an output principal plane 49, and a focal length "$F_1$" in the fast-axis direction. Input principal plane 48 is located a distance $F_1$ from front-facet 46. Fast-axis collimating lens 30 is arranged to intercept all rays of laser-radiation 42. Fast-axis collimating lens 30 collimates rays of laser-radiation 42 in the fast-axis direction and is benign in the slow-axis direction. Rays of laser-radiation 42 emitted by diode-laser bar 20 also diverge in the slow-axis direction, diverging at a FWHM angle between about 8° and 15°.

The optical powers of focusing lens 32 in the fast-axis and slow-axis directions are preferably about the same, as depicted in the drawings. Focusing lens 32 is located in plane 50 and has a focal length $F_2$ in the slow-axis direction. Focal length $F_2$ is generally much longer than focal length $F_1$. Focusing lens 32 is arranged to intercept all rays of laser-radiation 42 and direct the rays of laser-radiation onto linear micro-lens array 34. Plane 50 is located a distance "$d_1$" from front-facet 46 and a distance "$d_2$" from a front side 52 of linear micro-lens array 34. Distance $d_1$ is preferably equal to focal length $F_2$, to minimize incidence angles of rays of laser-radiation 42 on front side 52 and thereby maximize transmission of the laser-radiation through linear micro-lens array 34.

In the slow-axis direction, laser-radiation 42 emitted from each diode-laser emitter 22 is spread across front side 52 of linear micro-lens array 34 by focusing lens 32, illuminating every cylindrical micro-lens 40. Linear micro-lens array 34 is located and arranged for uniform illumination of front side 52. Preferably, distance $d_2$ is equal to focal length $F_2$, otherwise the uniform illumination of linear micro-lens array 34 becomes sensitive to distance $d_1$. In the fast-axis direction, rays of laser-radiation 42 are focused by focusing lens 32 in a plane 54, which includes or is proximate to linear micro-lens array 34.

Linear micro-lens array 34 has a back side 56, opposite front side 52. Rays of laser-radiation 44 emanating from each cylindrical micro-lens 40 on back side 56 are divergent in both the X and Y directions. Cylindrical lens 36 is arranged to intercept all rays of laser-radiation 44. Cylindrical lens 36 is located in plane 58 and has a focal length "$F_3$" in the X-direction. Cylindrical lens 36 is selected to illuminate a width of about W in the X-direction in another illumination plane 60. Illumination plane 60 is located at a distance $F_3$ from plane 58. Laser-radiation 44 emanating from each cylindrical micro-lens 40 overlaps with the laser-radiation from all the other cylindrical micro-lenses in illumination plane 60.

Although each diode-laser emitter 22 in diode-laser bar 20 is a discrete source of laser-radiation and the individual emitters may vary in brightness, illumination plane 60 is uniformly illuminated because each cylindrical micro-lens 40 is partially illuminated by every diode-laser emitter. Linear micro-lens array 34 thereby mixes laser-radiation from the individual diode-laser emitters, such that each micro-lens is a source of a mixed-beam of laser-radiation. Similarly, any angular bias in the emission from diode-laser bar 20 in the slow-axis direction is eliminated by linear micro-lens array 34 and cylindrical lens 36 cooperatively spreading and overlapping the mixed-beams of laser-radiation from all cylindrical micro-lenses 40 in illumination plane 60.

Cylindrical lens 38 is arranged to intercept all rays of laser-radiation 44 and form images of front facet 46 in an image plane 62 located a distance "$d_3$" from illumination plane 60. Cylindrical lens 38 focuses rays of laser-radiation 44 in the Y direction and is benign in the X direction. Cylindrical lens 38 has a focal length $F_4$ in the Y-direction. Distance $d_3$ is generally much shorter than focal lengths $F_3$ and $F_4$.

Fast-axis collimating lens 30, focusing lens 32, and cylindrical lens 38 cooperatively illuminate image plane 62 in the Y direction with images of diode-laser emitters 22. Two types of image are formed and superimposed in image plane 62, due to the rotation of diode-laser bar 20 with respect to linear micro-lens array 34. For a fast-axis component projected onto the Y direction, a far-field image of the diode-laser emitters is formed in image plane 62. Equivalently, an image is formed in another image plane 64 located a distance $F_1$ from output principal plane 49 that is a spatial Fourier transform of front facet 46. The Fourier transform image of front facet 46 is projected from image plane 64 to image plane 62. For a slow-axis component projected onto the Y-direction, a magnified image of diode-laser emitters 22 is formed in image plane 62.

Figure 3:
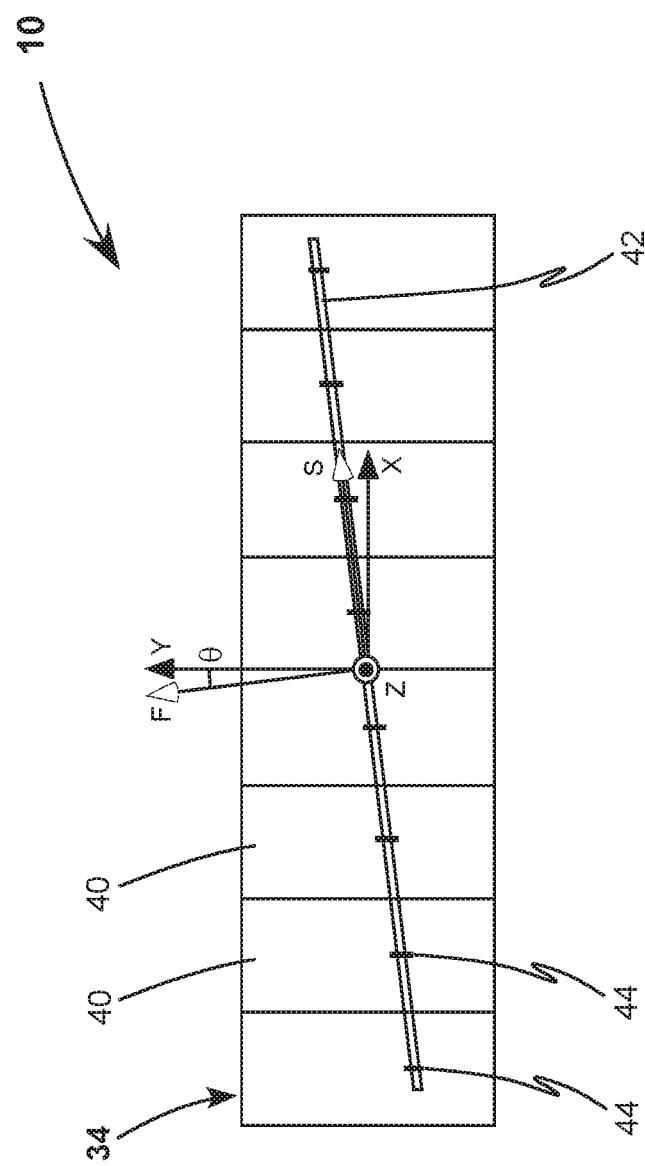
FIG. 3 is an end-elevation view schematically illustrating illumination of the linear micro-lens array in the line-beam generating apparatus of FIG. 1.

FIG. 3 schematically illustrates illumination of linear micro-lens array 34 in detail. In the end-elevation view of FIG. 3, illumination of front side 52 and emanation from back side 56 are superimposed. Rays of laser-radiation 42 illuminate an elongated rectangular area of front side 52, aligned with the slow-axis direction "S". Rays of laser-radiation 44 emanate from a small area in the vertex of each cylindrical micro-lens on back side 56. Projection of rays of laser-radiation 44 onto the Y-direction is determined by angle θ.

Figure 4:
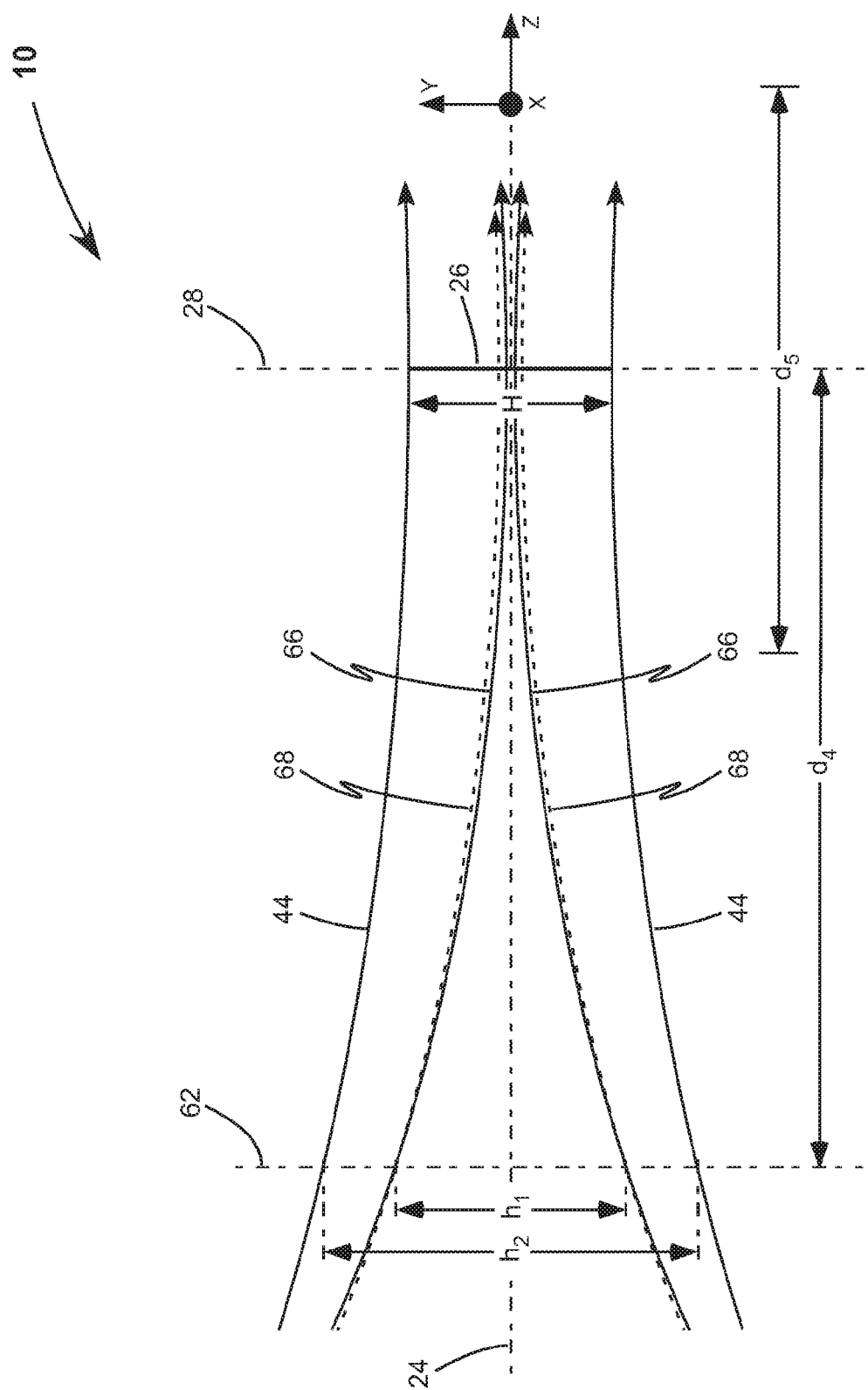
FIG. 4 is a side-elevation view schematically illustrating illumination of an image plane and the illumination plane by the rays of laser-radiation in the line-beam generating apparatus of FIG. 1.

FIG. 4 is a side-elevation view schematically illustrating rays of laser-radiation illuminating image plane 62 and illumination plane 28. FIG. 4 is drawn to scale for exemplary dimensions $F_1$=0.9 millimeters (mm), $F_2$=75 mm, $d_1$=$F_2$, $d_2$=$F_2$, and $F_4$=10 mm. Rays of laser-radiation 42 from diode-laser bar 20 have exemplary FWHM divergence in the fast-axis direction of 40°. Exemplary distance $d_4$=0.5 mm was selected to place illumination plane 28 close to a waist of the rays of laser-radiation, for purpose of demonstrating advantages of the present invention. Rays of laser-radiation 66 and 68 depict illumination for θ=0°, that is with the fast-axis and Y directions aligned.

Smile is defined here as the displacement between the highest and lowest diode-laser emitters in the fast-axis direction. Rays of laser-radiation 66 (solid line) depict illumination when diode-laser emitters have no smile. Rays of laser-radiation 68 (dotted line) depict illumination when the diode-laser emitters have a smile of 2.5 μm. Rays of laser-radiation 66 and 68 form line-beams in image plane 62 having the same height "$h_1$". The imaging properties of apparatus 10 create a line-beam in image plane 62 that is insensitive to smile.

Figure 5A:
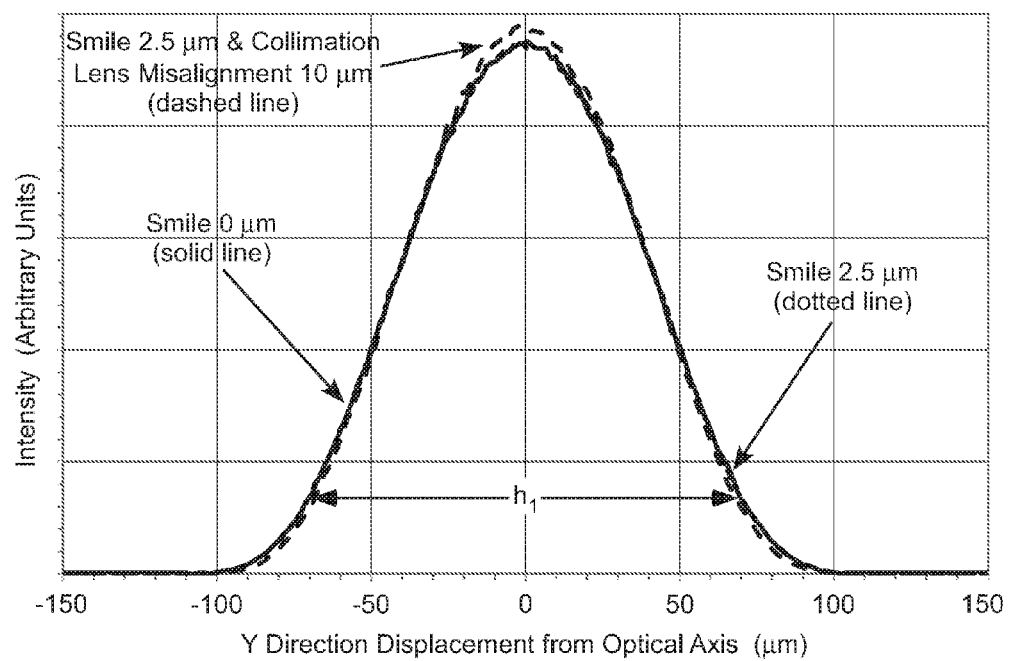
FIG. 5A is a graph schematically illustrating calculated laser-radiation intensity as a function of displacement from the optical axis in the image plane, for the diode-laser bar aligned in parallel with the linear micro-lens array in the apparatus of FIG. 1.

FIG. 5A is a graph depicting modeled intensity of laser-radiation in image plane 62, as a function of displacement along the Y direction from optical axis 24. A ray-tracing model of apparatus 10 was created using Zemax™ software for the exemplary dimensions above. Rays of radiation 66 (solid line) and rays of radiation 68 (dotted line) have the same calculated height of 142 μm, which is height $h_1$ in FIG. 4. Illumination of image plane 62 is insensitive to smile, so the intensity distributions for no smile (solid line) and 2.5 μm of smile (dotted line) overlap and are difficult to distinguish in the graph. Here, height and width of an intensity distribution are defined as height and width at 13.5% ($1/e^2$) of the maximum intensity.

FIG. 5A also depicts an exemplary intensity distribution (dashed line) for 2.5 μm of smile and fast-axis collimating lens 30 displaced from ideal alignment with optical axis 24 by 10 μm, representing an extreme case of relatively large smile plus optical misalignment. This extreme case has a calculated height in image plane 62 of 137 μm, which is just 3.5% smaller than the height without smile and misalignment. Again, the similarity of the intensity distributions in image plane 62 is attributable to the imaging properties of apparatus 10.

Figure 5B:
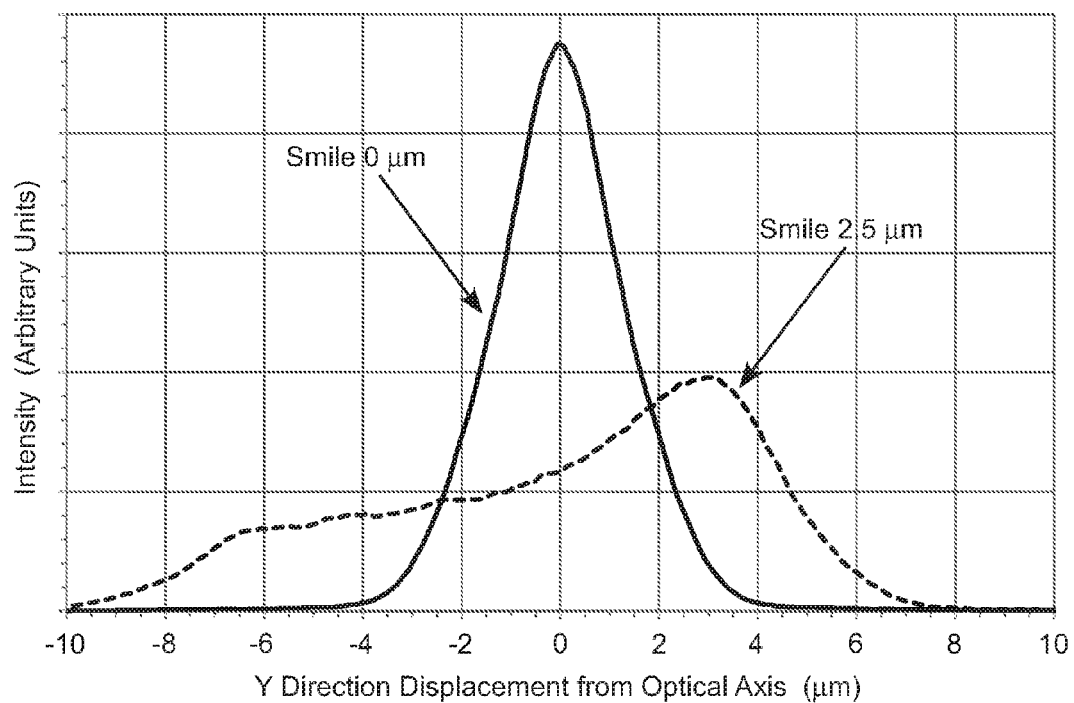
FIG. 5B is a graph schematically illustrating calculated laser-radiation intensity as a function of displacement from the optical axis in the illumination plane, for the diode-laser bar aligned in parallel with the linear micro-lens array in the apparatus of FIG. 1.

FIG. 5B is a graph depicting modeled intensity of laser-radiation in illumination plane 28, as a function of displacement along the Y direction from optical axis 24. Rays of laser-radiation 66 (no smile) have a symmetric intensity distribution (solid line) and a calculated height of 6 μm in illumination plane 28. Rays of laser-radiation 68 (smile of 2.5 μm) have a highly asymmetric intensity distribution (dotted line) and a larger calculated height of 14 μm. Large differences between the intensity distributions in FIG. 5B illustrate that the imaging properties of apparatus 10 diminish rapidly as distance $d_4$ increases, moving illumination plane 28 away from image plane 62.

Returning to FIG. 2B, projecting the far-field image of diode-laser emitters 22 from image plane 64 to image plane 62 has a further advantage. A smile-shaped relative displacement of the diode-laser emitters causes a non-uniform distribution of laser-radiation in the fast-axis direction, which is evident in the asymmetry of exemplary intensity distribution in illumination plane 28 depicted in FIG. 5B (dotted line). In contrast, all the exemplary intensity distributions in image plane 62 depicted in FIG. 5A are symmetric. An application that requires highly symmetric and uniform illumination in the Y direction could select an illumination plane 28 that is close to image plane 62.

Returning to FIG. 4, rays of laser-radiation 44 depict illumination for exemplary angle θ=7° between the fast-axis and Y directions. Increasing angle θ increases the height of rays of laser-radiation at all the locations along optical axis 24 depicted in the drawing. Rays of laser-radiation 44 have a height "$h_2$" in image plane 62 and height H in illumination plane 28. It should be noted that rays of laser-radiation 44 for no smile and for 2.5 μm of smile are indistinguishable on the scale of the drawing.

Figure 6A:
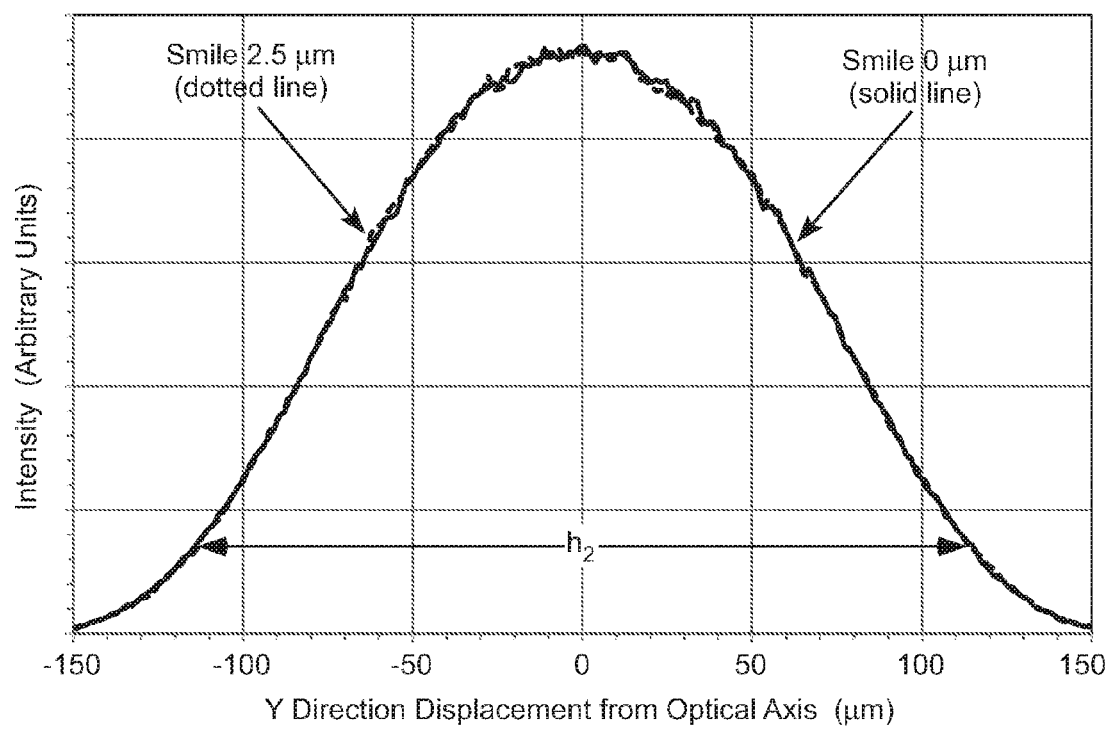
FIG. 6A is a graph schematically illustrating calculated laser-radiation intensity as a function of displacement from the optical axis in the image plane, for the diode-laser bar rotated from parallel alignment with the linear micro-lens array in the apparatus of FIG. 1.

FIG. 6A is a graph depicting modeled intensity of laser-radiation in image plane 62, as a function of displacement along the Y direction from optical axis 24. Rays of laser-radiation 44 for no smile (solid line) and for 2.5 μm of smile (dotted line) overlap and are indistinguishable in the graph. Calculated height $h_2$ in image plane 62 is 233 μm.

Figure 6B:
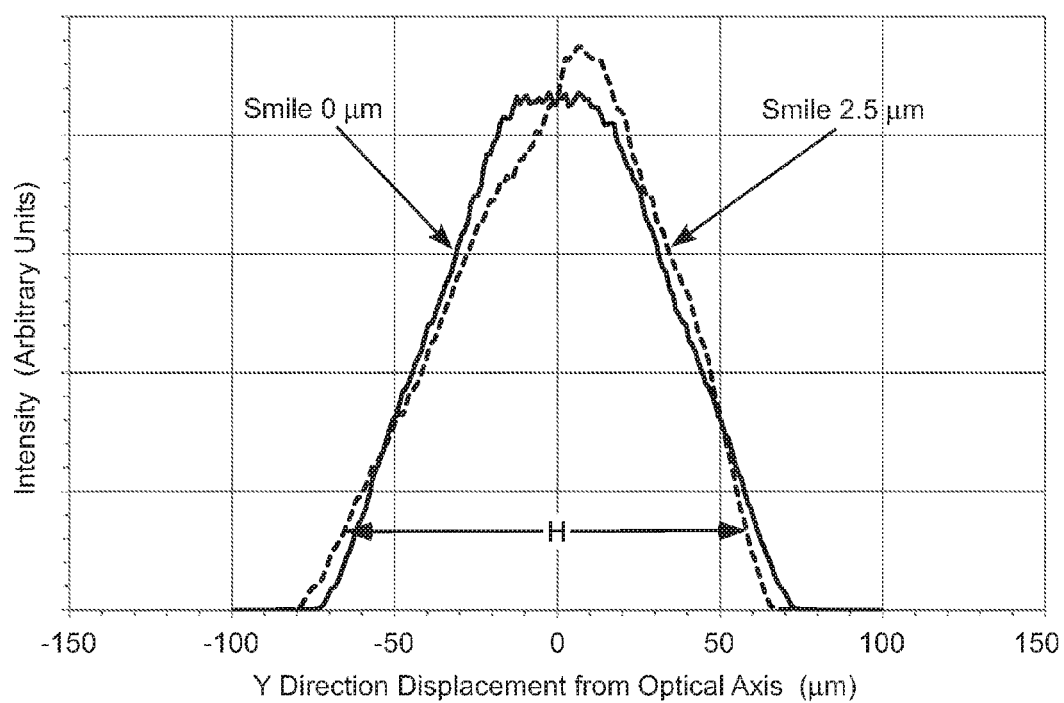
FIG. 6B is a graph schematically illustrating calculated laser-radiation intensity as a function of displacement from the optical axis in the illumination plane, for the diode-laser bar rotated from parallel alignment with the linear micro-lens array in the apparatus of FIG. 1.

FIG. 6B is a graph depicting modeled intensity of laser-radiation in illumination plane 28, as a function of displacement along the Y direction from optical axis 24. Rays of laser-radiation 44 for no smile (solid line) and for 2.5 μm of smile (dotted line) have similar intensity distributions, having the same calculated height H of 125 μm. FIG. 6B illustrates that apparatus 10 having diode-laser bar 20 rotated with respect to linear micro-lens array 34 is insensitive to smile over a range of distances $d_4$.

Figure 7:
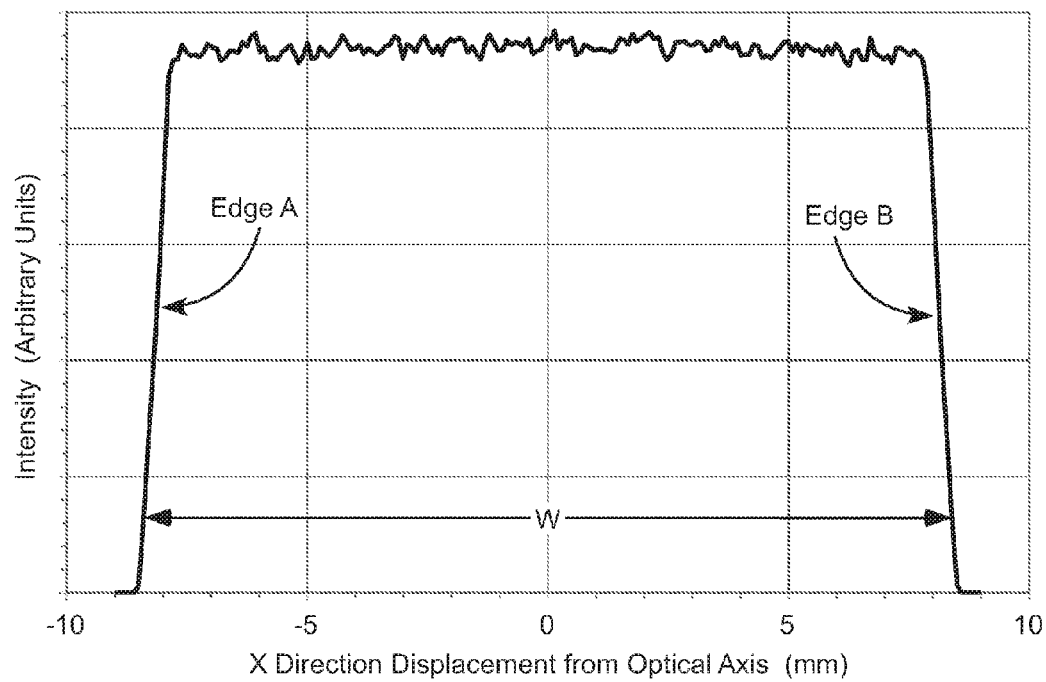
FIG. 7 is a graph schematically illustrating calculated laser-radiation intensity as a function of displacement from the optical axis in the illumination plane, for the diode-laser bar rotated from parallel alignment with the linear micro-lens array in the apparatus of FIG. 1.

FIG. 7 is a graph depicting modeled intensity of laser-radiation in illumination plane 28, as a function of displacement along the X direction from optical axis 24. FIG. 7 and FIG. 6B (dotted line) together depict elongated line-beam 26 in illumination plane 28 formed by rays of laser-radiation 44 for the exemplary dimensions above, $F_3$=100 mm, angle θ=7°, and smile of 2.5 μm. Elongated line-beam 26 has a calculated height H of 125 μm and width W of 17 mm in illumination plane 28.

Returning to FIG. 4, rotation of diode-laser bar 20 from parallel alignment with the linear micro-lens array has a further advantage of minimizing variation in height H as illumination plane 28 is moved along optical axis 24. Distance "$d_5$" is an exemplary range along optical axis 24 over which the height of beam of laser-radiation 44 is less than 1.1×H. An application could use apparatus 10 to generate a line-beam with a prescribed height of about H and width of about W that is insensitive to smile over a working distance $d_5$. Angle θ would be determined by the maximum smile that needs to be accommodated. There is a compromise between angle θ and the smallest height H that can be achieved, so an application requiring a narrow line-beam having relatively small height H would select the minimum angle θ required to mitigate sensitivity to smile.

Linear micro-lens array 34 is a single element in apparatus 10. However, the beam homogenizer could include two discrete micro-lens arrays spaced apart along optical axis 24, without departing from the spirit and scope of the present invention. In some applications a unitary homogenizer or compact two-element homogenizer would be preferable.

FIGS. 8A and 8B schematically illustrate another preferred embodiment 80 of line-beam generating apparatus in accordance with the present invention. Apparatus 80 is similar to apparatus 10 of FIG. 1, but further comprises an optional slow-axis collimating-lens array 82 and a linear micro-lens array 84. The optical elements of embodiment 80 to the right of linear micro-lens array 34 are the same as in the FIG. 1 embodiment, and are omitted for convenience of illustration.

The optical components are arranged along optical axis 24 in order from diode-laser bar 20: fast-axis collimating lens 30, optional slow-axis collimating-lens array 82, linear micro-lens array 84, focusing lens 32, and linear micro-lens array 34. Linear micro-lens array 84 includes a plurality of cylindrical micro-lenses 40 arranged in a linear array thereof along a transverse direction "X'". Each cylindrical micro-lens 40 has positive optical power in the X' direction and zero optical power in a direction "Y'" perpendicular to the X' direction.

The X' and Y' directions of linear micro-lens array 84 are rotated from parallel alignment with the X and Y directions of linear micro-lens array 34 by a fixed angle, which is between about 2° and 20°. This fixed rotation in apparatus 80 has the same effect as the fixed rotation of the diode-laser bar with respect to the linear micro-lens array in apparatus 10. In apparatus 80, the slow-axis and fast-axis directions of diode-laser bar 20 are preferably aligned parallel to the X and Y directions of linear micro-lens array 34, thereby aligning the polarization of rays of laser-radiation 44 with the geometric axes of elongated line-beam 26.

Optional slow-axis collimating-lens array 82 includes a plurality of lenses 86 arranged in a linear array thereof along the slow-axis direction. Each lens 86 has positive optical power in the slow-axis direction and zero optical power in the fast-axis direction. In a typical arrangement, each lens 86 collimates emission from one of the diode-laser emitters 22 of diode-laser bar 20 in the slow-axis direction. Optional slow-axis collimating-lens array 82 collimates rays of laser-radiation 88 emitted by diode-laser bar 20, such that all angles-of-incidence of rays of laser-radiation 88 are within the angle-of-acceptance of linear micro-lens array 84. Optional slow-axis collimating array 82 also enables diode-laser bar 20 to be separated from linear micro-lens array 84, creating space to accommodate other optical elements, such as filters and Bragg gratings.

Linear micro-lens array 84 in apparatus 80 is located in an equivalent location to diode-laser bar 20 in apparatus 10. Linear micro-lens array 84 is effectively the source of laser-radiation 42. Linear micro-lens array 84 may be selected to angularly distribute rays of laser-radiation 42 as required for uniform illumination of the linear micro-lens array 34.

Returning to FIG. 2A, laser-radiation 42 from each diode-laser emitter 22 is coherent. Coherent laser-radiation from an emitter is separated by linear micro-lens array 34 into a plurality of coherent beams of laser-radiation 44 that illuminate plane 60 from different incidence angles, thereby creating an interference pattern. Interference patterns from all the diode-laser emitters are superimposed in illumination plane 60, causing a structure in the illumination. Generally, the structure is more apparent for diode-laser emitters having narrow spectral bandwidth. Such structure would be detrimental in applications requiring uniform illumination.

Figure 9:
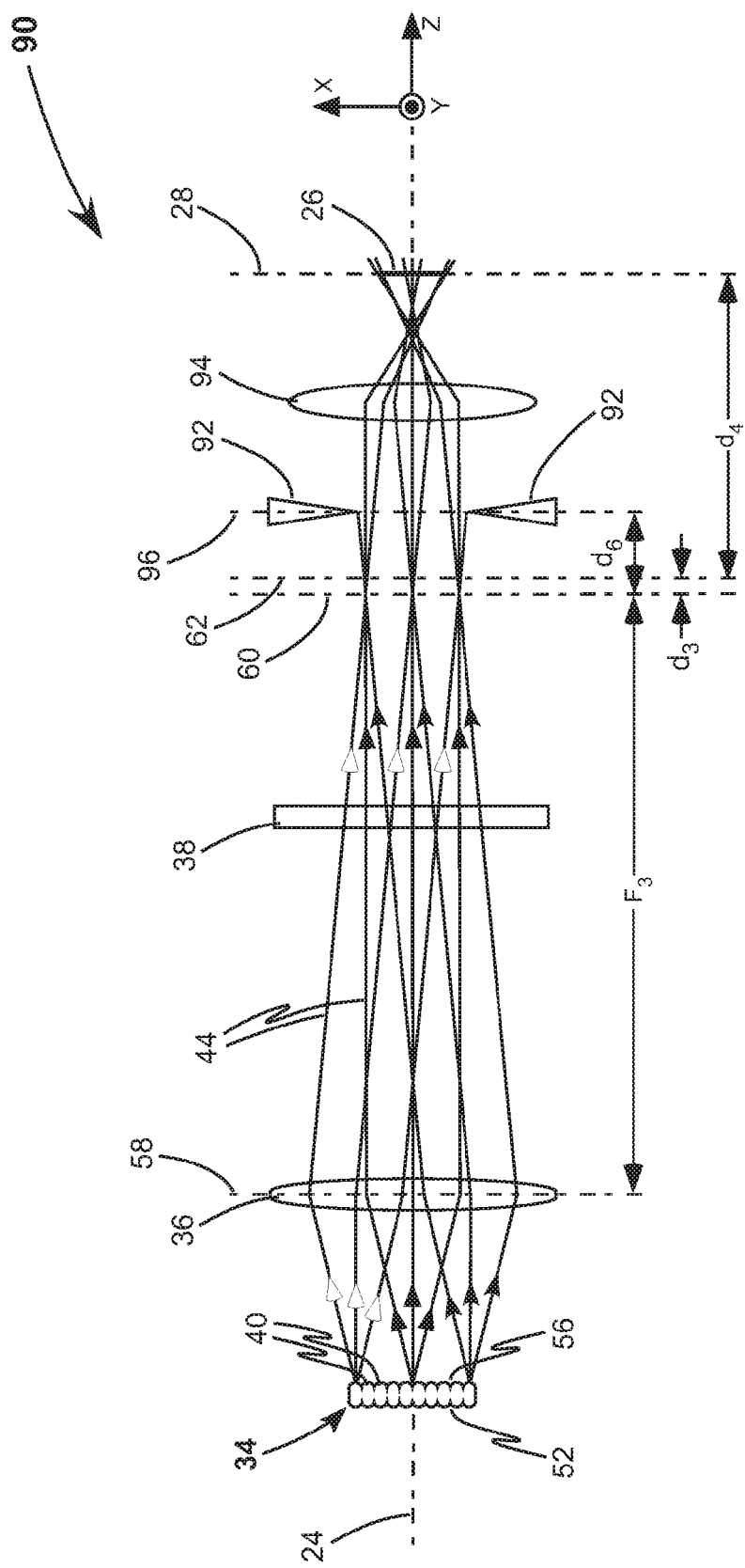
FIG. 9 is a plan view from above schematically illustrating yet another preferred embodiment of line-beam generating apparatus in accordance with the present invention, similar to the embodiment of FIG. 1, but further comprising an aperture and a spherical lens.

FIG. 9 schematically illustrates yet another preferred embodiment 90 of line-beam generating apparatus in accordance with the present invention. Apparatus 90 is similar to apparatus 10 of FIG. 1, but further comprises an aperture 92 and a spherical lens 94 located along optical axis 24. The optical elements of this embodiment to the left of linear micro-lens array 34 are the same as in the FIG. 1 embodiment or the FIG. 8A and FIG. 8B embodiment. In other words, the elements shown in FIG. 9 could be used with the optical elements of either FIG. 1 or FIG. 8. The optical elements to the left of linear micro-lens array 34 are omitted from FIG. 9 for convenience of illustration.

Linear micro-lens array 34 is uniformly illuminated by laser-radiation from diode-laser bar 20. Diode-laser bar 20 or linear micro-lens array 84 is rotated by angle θ with respect to linear micro-lens array 34 to form an elongated line-beam insensitive to smile over a range of distances. Therefore, another illumination plane 96 located distance $d_6$ away from illumination plane 60 may be selected. Distance $d_6$ is sufficient to mitigate structure caused by interference in the elongated line-beam.

Considering the propagation and diffraction of coherent beams of laser-radiation 44 from illumination plane 60, to mitigate structure in illumination plane 96, distance $d_6$ must be greater than $$\frac{\pi \cdot \lambda \cdot F_3^2}{N \cdot \Lambda^2}.$$

"λ" is the wavelength of the laser-radiation, N is the total number of micro-lenses, and "Λ" is the pitch of the linear micro-lens array. For the exemplary dimensions above, $\lambda$=660 nanometers (nm), N=40, and $\Lambda$=250 µm, $d_6$ must be greater than about 8.3 mm.

The elongated line-beam formed on illumination plane 60 has sharp edges in the X direction. Increasing distance $d_6$ degrades the sharpness of the edges of the elongated line-beam in illumination plane 96. Such degradation is apparent in the elongated line-beam of FIG. 7, which has inclined edges "Edge A" and "Edge B", instead of ideal sharp edges. Aperture 92 is located and arranged in illumination plane 96 to block those rays of laser-radiation 44 furthest from optical axis 24, thereby making ideal sharp edges. Spherical lens 94 projects the uniform illumination having ideal sharp edges from illumination plane 96 to illumination plane 28, making space along optical axis 24 to accommodate an application using elongated line-beam 26 in illumination plane 28.

It is preferable to select and arrange cylindrical lens 38 to locate image plane 62 in illumination plane 96 (to make $d_3$ equal to $d_6$). Locating the image plane in the illumination plane produces highly symmetric and uniform illumination in the Y direction, as discussed above.

The present invention is described above in terms of a preferred embodiment and other embodiments. The invention is not limited, however, to the embodiments described and depicted herein. Rather, the invention is limited only by the claims appended hereto.

What is claimed is:

1. An apparatus for generating a line-beam, comprising:
    a diode-laser bar emitting laser-radiation in an emission direction, the diode-laser bar having perpendicular slow-axis and fast-axis directions;
    a collimating lens arranged to intercept the laser-radiation and collimate the laser-radiation in the fast-axis direction;
    a focusing lens;
    a linear micro-lens array having a plurality of cylindrical micro-lenses arranged in an elongated array thereof, the linear micro-lens array having a first direction parallel with the elongated array of cylindrical micro-lenses and a second direction perpendicular to the elongated array of cylindrical micro-lenses;
    a first cylindrical lens and a second cylindrical lens;
    wherein the collimating lens, the focusing lens, the linear micro-lens array, the first cylindrical lens, and the second cylindrical lens located in recited order along an optical axis in the emission direction, and arranged to form the line-beam from the laser-radiation emitted by the diode-laser bar; and
    wherein, the slow-axis and fast-axis directions are rotated from parallel alignment with the first and second directions by a fixed angle of at least 2°.

2. The apparatus of claim 1, where in the fixed angle is between about 2° and 20°.

3. The apparatus of claim 1, wherein the first cylindrical lens has positive optical power in the first direction and the second cylindrical lens has positive optical power in the second direction.

4. The apparatus of claim 1, wherein the collimating lens, the focusing lens, and the second cylindrical lens are selected and arranged to illuminate an image plane in the second direction with a far-field image of the diode-laser bar.

5. The apparatus of claim 1, wherein the collimating lens has a first focal length, the collimating lens and the diode-laser bar being separated by about the first focal length.

6. The apparatus of claim 1, wherein the focusing lens has positive optical powers in the fast-axis and slow-axis directions.

7. The apparatus of claim 6, wherein the optical powers of the focusing lens are about the same in the slow-axis and fast-axis directions.

8. The apparatus of claim 1, wherein the focusing lens has a second focal length in the slow-axis direction, the focusing lens and the diode-laser bar being separated by about the second focal length.

9. The apparatus of claim 8, wherein the focusing lens and the linear micro-lens array are separated by about the second focal length.

10. The apparatus of claim 1, wherein the diode-laser bar includes a plurality of diode-laser emitters, the focusing lens and the linear micro-lens array arranged to spread the laser-radiation in the slow-axis direction and illuminate every one of the cylindrical micro-lenses with laser-radiation from every one of the diode-laser emitters.

11. The apparatus of claim 10, wherein each cylindrical micro-lens is a source of mixed laser-radiation, the first cylindrical lens arranged to overlap mixed laser-radiation from every one of the cylindrical micro-lenses in a first illumination plane, the overlapping mixed-beams of laser-radiation forming the line-beam in the first illumination plane, the line-beam being parallel with the first direction.

12. The apparatus of claim 11, wherein the first cylindrical lens has a third focal length, the first cylindrical lens and the first illumination plane being separated by about the third focal length.

13. An apparatus for generating a line-beam, comprising:
    a diode-laser bar emitting laser-radiation in an emission direction, the diode-laser bar having perpendicular slow-axis and fast-axis directions;
    a fast-axis collimating lens arranged to intercept the laser-radiation and collimate the laser-radiation in the fast-axis direction;
    a first linear micro-lens array having a plurality of first cylindrical micro-lenses arranged in an elongated array thereof, the first linear micro-lens array having a first direction parallel with the elongated array of first cylindrical micro-lenses and a second direction perpendicular to the elongated array of first cylindrical micro-lenses;
    a focusing lens;
    a second linear micro-lens array having a plurality of second cylindrical micro-lenses arranged in an elongated array thereof, the second linear micro-lens array having a third direction parallel with the elongated array of second cylindrical micro-lenses and a fourth direction perpendicular to the elongated array of second cylindrical micro-lenses;
    a cylindrical lens;
    wherein the fast-axis collimating lens, the first linear micro-lens array, the focusing lens, the second linear micro-lens array, and the cylindrical lens located in recited order along an optical axis in the emission direction, and arranged to form the line-beam from the laser-radiation emitted by the diode-laser bar; and
    wherein, the first and second directions are rotated from parallel alignment with the third and fourth directions by a fixed angle of at least 2°.

14. The apparatus of claim 13, wherein the fixed angle is between about 2° and 20°.

15. The apparatus of claim 13, wherein the slow-axis direction is parallel to the third direction and the fast-axis direction is parallel to the fourth direction.

16. The apparatus of claim 13, wherein the focusing lens has positive optical powers in the first and second directions, and the cylindrical lens has positive optical power in the third direction.

17. The apparatus of claim 13, further including a slow-axis collimating-lens array located on the optical axis between the fast-axis collimating lens and the first linear micro-lens array, the slow-axis collimating-lens array arranged to intercept the laser-radiation and collimate the laser-radiation in the slow-axis direction.

18. An apparatus for generating a line-beam, comprising:
a diode-laser bar emitting laser-radiation in an emission direction, the diode-laser bar having perpendicular slow-axis and fast-axis directions;
a collimating lens arranged to intercept the laser-radiation and collimate the laser-radiation in the fast-axis direction;
a focusing lens;
a linear micro-lens array having a plurality of cylindrical micro-lenses arranged in an elongated array thereof, the linear micro-lens array having a first direction parallel with the elongated array of cylindrical micro-lenses and a second direction perpendicular to the elongated array of cylindrical micro-lenses, the slow-axis and fast-axis directions rotated from parallel alignment with the first and second directions by a fixed angle of at least 2°, the focusing lens and the linear micro-lens array arranged for uniform illumination of the linear micro-lens array by the laser-radiation;
a cylindrical lens, the collimating lens, the focusing lens, the linear micro-lens array and the cylindrical lens located in recited order along an optical axis in the emission direction, and arranged to form the line-beam in a first illumination plane from the laser-radiation emitted by the diode-laser bar;
an aperture located in a second illumination plane, the aperture arranged to partially block the line-beam in the first direction; and
a spherical lens, the spherical lens located on the optical axis and arranged to project an image of the partially-blocked line-beam in the second illumination plane to a third illumination plane.

19. The apparatus of claim 18, where in the fixed angle is between about 2° and 20°.

20. The apparatus of claim 18, wherein the cylindrical lens has positive optical power in the first direction.

21. The apparatus of claim 18, wherein the cylindrical lens has a focal length, the cylindrical lens and the first illumination plane being separated by about the focal length.

22. The apparatus of claim 18, wherein each cylindrical micro-lens is a source of laser-radiation, the cylindrical lens arranged to overlap laser-radiation from every one of the cylindrical micro-lenses in the first illumination plane, the overlapping laser-radiation forming the line-beam in the first illumination plane, the line-beam being parallel with the first direction.

23. An apparatus for generating a line-beam, comprising:
a diode-laser bar emitting laser-radiation in an emission direction, the diode-laser bar having perpendicular slow-axis and fast-axis directions;
a fast-axis collimating lens arranged to intercept the laser-radiation and collimate the laser-radiation in the fast-axis direction;
a first linear micro-lens array having a plurality of first cylindrical micro-lenses arranged in an elongated array thereof, the first linear micro-lens array having a first direction parallel with the elongated array of first cylindrical micro-lenses and a second direction perpendicular to the elongated array of first cylindrical micro-lenses;
a focusing lens;
a second linear micro-lens array having a plurality of second cylindrical micro-lenses arranged in an elongated array thereof, the second linear micro-lens array having a third direction parallel with the elongated array of second cylindrical micro-lenses and a fourth direction perpendicular to the elongated array of second cylindrical micro-lenses, the first and second directions rotated from parallel alignment with the third and fourth directions by a fixed angle of at least 2°, the focusing lens and the second linear micro-lens array arranged for uniform illumination of the second linear micro-lens array by the laser-radiation;
a cylindrical lens, the fast-axis collimating lens, the first linear micro-lens array, the focusing lens, the second linear micro-lens array, and the cylindrical lens located in recited order along an optical axis in the emission direction, and arranged to form the line-beam in a first illumination plane from the laser-radiation emitted by the diode-laser bar;
an aperture located in a second illumination plane, the aperture arranged to partially block the line-beam in the third direction; and
a spherical lens, the spherical lens located on the optical axis and arranged to project an image of the partially-blocked line-beam in the second illumination plane to a third illumination plane.

24. The apparatus of claim 23, wherein the fixed angle is between about 2° and 20°.

25. The apparatus of claim 23, wherein the slow-axis direction is parallel to the third direction and the fast-axis direction is parallel to the fourth direction.

26. The apparatus of claim 23, wherein the focusing lens has positive optical powers in the first and second directions, and the cylindrical lens has positive optical power in the third direction.

27. The apparatus of claim 23, further including a slow-axis collimating-lens array located on the optical axis between the fast-axis collimating lens and the first linear micro-lens array, the slow-axis collimating-lens array arranged to intercept the laser-radiation and collimate the laser-radiation in the slow-axis direction.

28. The apparatus of claim 23, wherein the cylindrical lens has a focal length, the cylindrical lens and the first illumination plane being separated by about the focal length.

29. The apparatus of claim 23, wherein each second cylindrical micro-lens is a source of laser-radiation, the cylindrical lens arranged to overlap laser-radiation from every one of the second cylindrical micro-lenses in the first illumination plane, the overlapping laser-radiation forming the line-beam in the first illumination plane, the line-beam being parallel with the third direction.

* * * * *